US011217713B2

(12) United States Patent
Pelletier et al.

(10) Patent No.: US 11,217,713 B2
(45) Date of Patent: Jan. 4, 2022

(54) MANAGING STRAY LIGHT ABSORPTION IN INTEGRATED PHOTONICS DEVICES

(71) Applicant: Ciena Corporation, Hanover, MD (US)

(72) Inventors: François Pelletier, Saint-Michel (CA); Sean Sebastian O'Keefe, Dunrobin (CA); Christine Latrasse, Quebec (CA); Yves Painchaud, Quebec (CA)

(73) Assignee: Ciena Corporation, Hanover, MD (US)

( * ) Notice: Subject to any disclaimer, the term of this patent is extended or adjusted under 35 U.S.C. 154(b) by 185 days.

(21) Appl. No.: 16/741,988

(22) Filed: Jan. 14, 2020

(65) Prior Publication Data

US 2021/0167230 A1 Jun. 3, 2021

Related U.S. Application Data

(60) Provisional application No. 62/942,358, filed on Dec. 2, 2019.

(51) Int. Cl.
*H01L 31/0232* (2014.01)
*H01L 27/144* (2006.01)

(52) U.S. Cl.
CPC .... *H01L 31/02327* (2013.01); *H01L 27/1446* (2013.01)

(58) Field of Classification Search
None
See application file for complete search history.

(56) References Cited

U.S. PATENT DOCUMENTS

| | | | |
|---|---|---|---|
| 6,298,178 B1 * | 10/2001 | Day | G02B 6/12004 385/14 |
| 10,332,732 B1 * | 6/2019 | Smith | H01J 31/50 |
| 2005/0053383 A1 | 3/2005 | West et al. | |
| 2015/0108336 A1 * | 4/2015 | Dong | G01J 1/0425 250/227.28 |
| 2017/0031113 A1 | 2/2017 | Chen et al. | |
| 2017/0104109 A1 | 4/2017 | Simoyama | |
| 2019/0219782 A1 * | 7/2019 | Liow | G02B 6/43 |

OTHER PUBLICATIONS

Alloatti et al., "Photonics design tool for advanced CMOS nodes", IET Optoelectronics, vol. 9, Iss. 4, pp. 163-167, 2015.
Bogaerts et al., "Silicon Photonics Circuit Design: Methods, Tools and Challenges", Laser Photonics Rev. 1700237, 2018.
Chen et al., "Area Fill Synthesis for Uniform Layout Density", IEEE Transactions on Computer-Aided Design of Integrated Circuits and Systems, vol. 21, No. 10, pp. 1132-1147, Oct. 2002.
Pfeiffer et al., "Photonic Damascene Process for Low-Loss, High-Confinement Silicon Nitride Waveguides", IEEE Journal of Selected Topics in Quantum Electronics, vol. 24, No. 4, Jul./Aug. 2018.

* cited by examiner

*Primary Examiner* — Robert K Carpenter
(74) *Attorney, Agent, or Firm* — Young Basile Hanlon & MacFarlane, P.C.

(57) ABSTRACT

Fabricating a photonic integrated circuit includes fabricating structures in one or more silicon layers. At least a first silicon layer comprises: one or more photonic structures, where the photonic structures include one or more waveguides and one or more photodetectors, and one or more light absorbing structures, where at least some of the light absorbing structures include doped silicon. Fabricating the photonic integrated circuit also includes fabricating at least one waveguide in the photonic integrated circuit for receiving light into at least one of the silicon layers.

18 Claims, 2 Drawing Sheets

_(1)_

MANAGING STRAY LIGHT ABSORPTION IN INTEGRATED PHOTONICS DEVICES

CROSS-REFERENCE TO RELATED APPLICATION(S)

This application claims priority to and the benefit of U.S. Provisional Application Patent Ser. No. 62/942,358, filed Dec. 2, 2019, the entire disclosure of which is hereby incorporated by reference.

TECHNICAL FIELD

This disclosure relates to managing stray light absorption in integrated photonics devices.

BACKGROUND

Photonic integrated circuits (PICs) often include optical waveguides for transporting optical waves around a device and into and out of various photonic structures (e.g., splitters, modulators, interferometers, resonators, multimode interference (MMI) couplers, photodetectors, etc.). An optical waveguide is a photonic structure that confines and guides the propagation of an electromagnetic wave. Some electromagnetic waves have a spectrum that has a peak wavelength that falls in a particular range of optical wavelengths (e.g., between about 100 nm to about 1 mm, or some subrange thereof), also referred to as "optical waves," "light waves," or simply "light." These optical waveguides may be implemented, for example, by forming a core structure from a material having a higher refractive index (e.g., silicon, or silicon nitride) surrounded by a cladding (also called a "buffer") comprising one or more materials (or air) that have a lower refractive index. For example, the core structure may be formed by the silicon layer over a buried oxide (BOX) layer (e.g., silicon dioxide) of a substrate, such as a silicon-on-insulator (SOI) wafer, while the cladding would be formed by the oxide of the BOX layer and the silicon dioxide deposited on top of the core structure. The cladding may in some cases be formed by a single lower-index material (or air), or by multiple different lower-index materials (or air). Air can act as cladding, for example, if a core material is deposited on top of a cladding material without another material being deposited on top of the core material, or if a core material is suspended above a substrate.

SUMMARY

In one aspect, in general, an article of manufacture comprises: a photonic integrated circuit that includes one or more silicon layers, where at least a first silicon layer comprises: one or more photonic structures, where the photonic structures include one or more waveguides and one or more photodetectors, and one or more light absorbing structures, where at least some of the light absorbing structures include doped silicon; and at least a first waveguide in the photonic integrated circuit for receiving light into at least one of the silicon layers.

In another aspect, in general, a method for fabricating a photonic integrated circuit comprises: fabricating structures in one or more silicon layers, where at least a first silicon layer comprises: one or more photonic structures, where the photonic structures include one or more waveguides and one or more photodetectors, and one or more light absorbing structures, where at least some of the light absorbing structures include doped silicon; and fabricating at least one waveguide in the photonic integrated circuit for receiving light into at least one of the silicon layers.

Aspects can include one or more of the following features.

The article of manufacture further comprises: at least a first input port in the photonic integrated circuit for receiving first light into the first waveguide, the first light characterized by a first intensity; and at least a second input port in the photonic integrated circuit for receiving second light into a waveguide in one of the silicon layers, the second light characterized by a second intensity lower than the first intensity; wherein at least a first photodetector of the one or more photodetectors is positioned at a location in the photonic integrated circuit that: (1) receives a portion of the second light from a first waveguide coupled to the first photodetector, and (2) receives a portion of the first light scattered into the first photodetector from a portion of the photonic integrated circuit other than the first waveguide.

The first silicon layer comprises a layer of silicon in a silicon-on-insulator structure that includes a layer of silicon dioxide adjacent to the layer of silicon.

The doped silicon of one or more of the light absorbing structures is characterized by a dopant concentration of greater than 1018 atoms per cubic centimeter.

At least some of the light absorbing structures include a structure consisting essentially of a doped silicon structure at least partially covered with germanium.

The light absorbing structures include a first set of light absorbing structures each consisting essentially of a doped silicon structure and a second set of light absorbing structures each consisting essentially of a doped silicon structure at least partially covered with germanium, and the quantity of light absorbing structures in the first set is greater than the quantity of light absorbing structures in the second set.

At least one of the photodetectors in the first silicon layer is closer to a plurality of the light absorbing structures in the in the first set than to any of the light absorbing structures in the second set.

At least one photodetector comprises a photodiode formed at least in part from germanium covering a portion of the doped silicon of the first silicon layer.

The light absorbing structures include a plurality of doped silicon structures that each: has a cross-sectional shape that is approximately a polygon, in a cross-sectional plane within the first silicon layer, is in proximity to neighboring doped silicon structures that together form a tiled pattern in the cross-sectional plane, and/or is separated from neighboring doped silicon structures in the cross-sectional plane by silicon dioxide.

Aspects can have one or more of the following advantages.

The techniques described herein provide a mechanism for absorbing stray light in a PIC using material layers and fabrication steps that are compatible with those typically available in existing facilities that are used for semiconductor fabrication (e.g., complementary metal-oxide-semiconductor (CMOS) fabrication facilities). By covering a significant portion of the area of a chip with light absorbing structures (e.g., tiled structures or uniform/fully dense structures), the amount of stray light left to spread to functional photonic structures on the chip can be effectively reduced, with minimal or no impact on cost. In some fabrication facilities, there may be design rules imposed on the fabrication process that state that open/unused areas of a mask need to be filled with tiled structures in order to maintain a certain percentage fill of the mask area. In some cases, such "tiling" (also called "filler patterns") may be used for mechanical purposes, such as reducing stress, increasing uniformity of structure density, or improving uniformity of etching results. Taking advantage of these structures for an additional purpose of absorbing stray light can improve optical performance of the devices on the chip with minimal negative impact on yield. Some examples of the devices on a PIC chip that could benefit from such a reduction in stray light include optical coherent receivers, coherent transmitters, and tap photodetectors, all of which benefit in some way from the extended dynamic range that would be achievable by reducing stray light. For example, in some implementations, the dynamic range could be increased up to 5-7 dB or more depending on tiling density and device configuration. There are also potential cost benefits that could be achieved by reducing the need for other, potentially more expensive, techniques for reducing or managing the effects of stray light, as described in more detail below.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
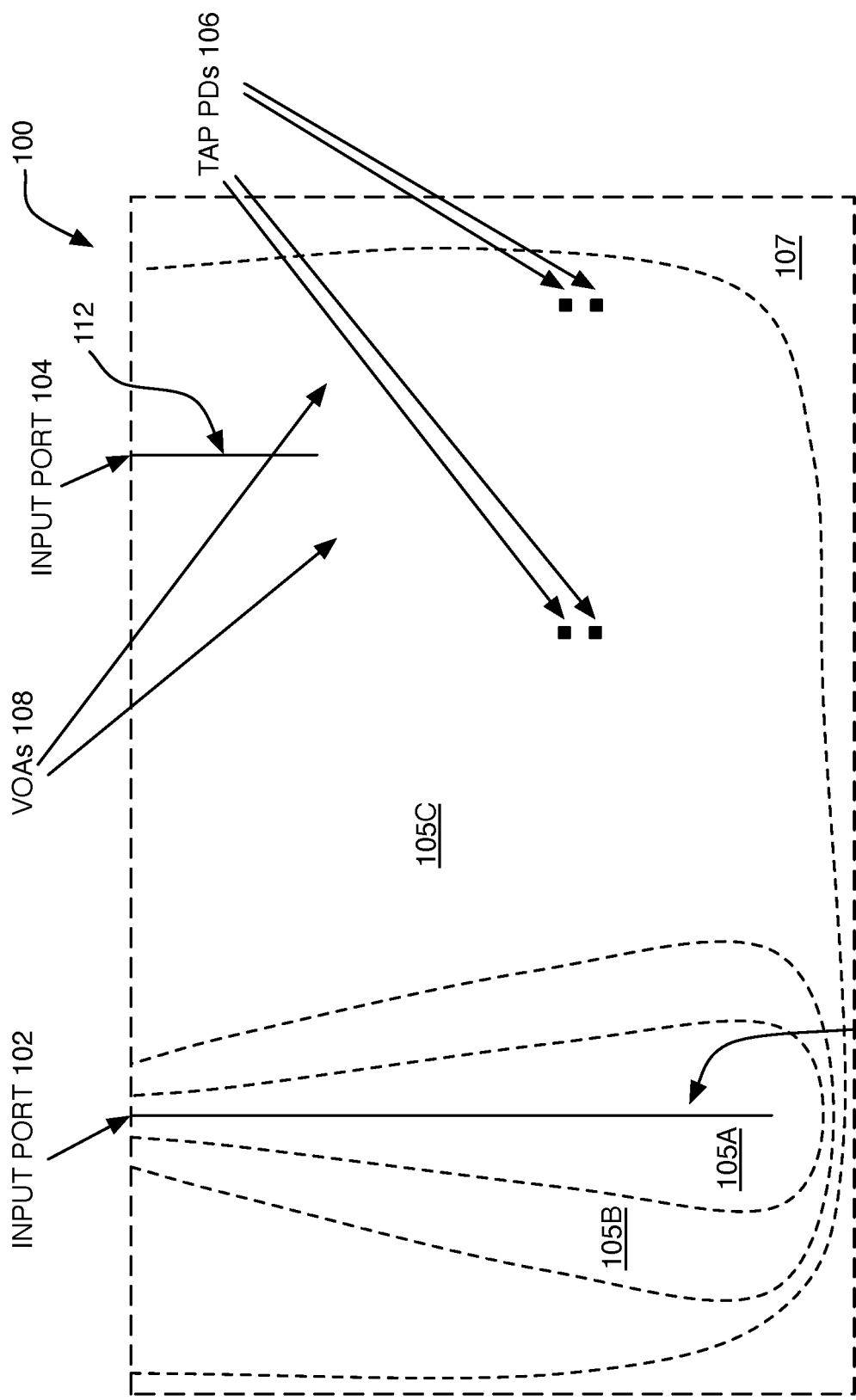
FIG. 1 is a schematic diagram of a portion of photonic integrated circuit illustrating the spread of stray light associated with an optical wave being coupled into an input port.

One of the reasons that it may be convenient to fabricate photonic integrated circuits using fabrication techniques used for electrical (e.g., CMOS) integrated circuits (ICs) is that optical signals carried by optical waves can be used in the same chip where electrical signals are carried by an electrical current or voltage. In some cases, a variety of photonic and electronic devices can be integrated into the same chip. One kind of device that is used both in chips that contain mostly PIC devices and chips that integrate PIC and IC devices is a photodetector (or a photoreceiver) that converts an optical signal into an electrical signal. An example of a platform that can be used for PIC and IC devices is a silicon photonics (SiP) platform. A SiP chip can be fabricated using a silicon wafer (e.g., a silicon-on-insulator (SOI) wafer) that is processed using various standard fabrication process steps and diced to yield individual SiP dice.

A photodetector can be formed from a photonic structure called a photodiode, which is able to convert the photons of a received optical wave into a photocurrent. This photocurrent can then be further processed by an electronic circuit to provide an output current or an output voltage (e.g., in a transimpedance amplifier). Such photodetector devices formed using photodiodes can be used, for example, to detect a variety of types of optical signals coming from various types of photonic devices (e.g., an optical modulator), which may be formed from specific photonic structures (e.g., a Mach-Zehnder interferometer, or a ring resonator). In order to monitor the activity of these photonic devices, a small amount of light can be coupled out of a waveguide using a directional coupler or a multi-mode interference splitter, for example, and sent to these monitoring photodetectors.

In some cases, it may be beneficial for a device receiving an optical signal to have a large dynamic range, such that both strong signals (carried on an optical wave with a relatively high optical power) and weak signals (carried on an optical wave with a relatively low optical power) are able to be detected. However, if the optical wave being detected has a low optical power, then it may be more vulnerable to stray light leaking into the detector, or into a waveguide coupled to the detector, from somewhere other than an intended source. One potential source of stray light may occur due to a mismatch between intensity profiles of different guided modes of different respective waveguides that are coupled to each other. For example, if there is imperfect alignment between an optical fiber and an input port of a PIC, some of the power in the mode of the optical fiber that is not perfectly matched to the mode of the input port can make its way into a substrate of the PIC, or the silicon dioxide cladding layers that surround the optical waveguides. Similarly, if different types of waveguides on a PIC are coupled without a sufficiently adiabatic transition between the different waveguides, there may be some stray light that is lost to a surrounding substrate. For example, if the PIC comprises a SiP die, light may leak into the silicon substrate, the BOX layer of the SOI substrate, or the silicon dioxide that has been deposited above a layer of photonic structures. Even if light is received from an output mode of a laser or other light source integrated in the SiP (i.e., without requiring an explicit input port requiring alignment), stray light from the source outside of the output mode may also leak out of the source and into the SiP die. Some structures in the SiP die, such as imperfectly terminated unused ports of couplers, may also scatter stray light. Another potential source of stray light is scattering from waveguide surfaces that are not sufficiently smooth (e.g., from rough sidewalls of a ridge waveguide or a rib waveguide). While light can also be scattered due to route changes in a waveguide (e.g., bends that have a radius that too large to maintain total internal reflection of light in a guided mode), the bends in a waveguide are typically designed to be large enough to avoid such losses. Such stray light from any of these causes can then undesirably propagate to and illuminate some or all of the photodiodes in the PIC.

FIG. 1 shows a portion of PIC in a SiP die 100 that includes structures that would be present in a typical integrated system, such as an optical front end of a coherent receiver, and illustrates an example of the effects of stray light. In this example, some optical structures and other fabricated structures (e.g., metal conducting paths) are not shown for clarity. But, this example does show an input port 102 for coupling the local oscillator (LO) light into an optical waveguide 110, and another input port 104 for coupling the receiver signal (SIG) light into another optical waveguide 112 (with only portions of the optical waveguides 110 and 112 being shown). The propagation of stray light over portions of the SiP die 100 are represented by different stray light regions 105A, 105B, and 105C in which stray light would have different respective ranges of intensity, with the region 105A having the highest intensity of stray light, and the regions 105B and 105C having lower intensities of stray light. While the actual amount of loss represented by the light that spreads into the stray light regions 105A, 105B, and 105C may be relatively small (e.g., 0.1%), even a small loss from a sufficiently intense optical wave can result in a significant amount of stray light. In this example, the wavelength of both the LO light and the SIG light is in the infrared (IR) portion of the electromagnetic spectrum, around 1550 nm.

The stray light regions 105A, 105B, and 105C in this example are mostly a result of to the relatively intense unguided LO light that is leaking into surrounding portions of the substrate and upper-cladding, due mainly to misalignment at the input port 102. The brightest stray light region 105A would be near the initial path of the LO light, but the other stray light regions 105B and 105C could still receive significant amounts of the leakage LO light, which can cause problems for signal measurement of the SIG light. While the placement of these or other detectors would ideally be in relatively dark regions that are not as intensely illuminated by stray light as the stray light regions 105A-C, such selective placement may not always be possible. So, it is useful to absorb as much of this stray light as possible within as many of the stray light regions as possible in order to make the whole SiP die 100 darker.

In this example, there are tap photodiodes (PDs) 106 that are used to detect the amount of SIG light received at the input port 104 that is delivered by an optical waveguide before and after sets of in-line variable optical attenuators (VOAs) 108. Such measurements can be used for a variety of applications (e.g., input or output referred optical power monitoring, Mach-Zehnder Modulator (MZM) quadrature locking circuits, etc.). These tap PDs 106 are in the stray light region 105C of the SiP die 100 that is being illuminated by a significant amount of the leaked LO light. This illumination by stray light may be undesirable since it can limit the dynamic range attainable by the tap PDs 106. For example, if the SIG light is relatively weak after attenuation and the LO is relatively strong, the leaked LO light that reaches a tap PD may be strong enough generate noise that degrades the SIG light measurement.

In order to reduce the amount of stray light propagating in one or more of the different layers of a PIC, structures can be incorporated into the PIC to absorb at least a portion of the stray light. Such light absorbing structures are able to reduce the intensity of any remaining stray light that may reach the photodiodes. In some implementations, techniques and materials that are compatible for use in CMOS fabrication facilities can be configured for forming light absorbing structures in a PIC device such as a SiP die (or in an integrated PIC/IC device). For example, some of the materials that can be used to generate light absorbing structures in the layers of a PIC fabricated using a CMOS process are: doped silicon, germanium, and metals, as described in more detail below.

Structures formed from doped silicon can be effective at absorbing stray light. Doping a material such as silicon can be accomplished as part of a standard CMOS fabrication process by introducing atoms of a foreign material (also called "impurities"), which can be of two different types: an n-type dopant (which provides free electrons as negative charge carriers), or a p-type dopant (which provides mobile holes as positive charge carriers). Examples of p-type dopants include boron, gallium, or aluminum. Examples of n-type dopants include arsenic, phosphorous, or antimony. A silicon layer that is to be doped (as part of the CMOS fabrication process) can be, for example, an initial silicon layer that is also used to form waveguides and other photonic structures, or another silicon layer that is grown during the CMOS fabrication process. Whatever silicon layer(s) are used for doping, it is useful if the silicon is as highly doped as possible to render it as absorbing as practically possible.

The concentration of a dopant can be characterized by different degrees of concentration, which can be associated with corresponding symbols (P for p-type, and N for n-type) within various quantitative ranges. A "P" or "N" designation of concentration is a moderate degree of doping (e.g., a concentration of less than $10^{18}$ atoms per cubic centimeter). A "P$^+$" or "N$^+$" designation of concentration is a heavy degree of doping (e.g., a concentration of between about $10^{18}$ to $10^{20}$ atoms per cubic centimeter). A "P$^{++}$" or "N$^{++}$" designation of concentration is an even heavier degree of doping (e.g., a concentration of greater than about $10^{20}$ atoms per cubic centimeter). A P$^{++}$ or N$^{++}$ concentration is effective for the absorbing structures in a silicon layer, whereas undoped silicon has relatively little absorption (which is why it is typically used to form optical waveguides).

Germanium can be grown onto portions of a wafer using an epitaxy process. The germanium can be grown in thicknesses from 100 nm to a few microns. In some implementations, a germanium structure is grown on top of a silicon structure. For example, the silicon structure can be in the form of a tile (e.g., a square tile) that has been etched within a silicon layer, and the germanium can be in the form of a smaller tile positioned on top of the silicon tile. Germanium is an effective absorbing material, and thus may be able to absorb a significant portion of the stray light. The silicon underneath the germanium can be doped to any degree, or can remain undoped. There may be rules associated with the CMOS fabrication process that limit the quantity of germanium that can be grown (e.g., due to the stress caused by the lattice mismatch) and/or the proximity of the germanium to other photonic structures, including photodiodes, also formed using germanium. The germanium can be grown on silicon with various amounts of doping, from undoped to very highly doped.

Metal can also be used as an absorber. An electromagnetic wave having a wavelength in the visible or infra-red part of the spectrum propagates into metals with a very high attenuation. This is characterized by the high imaginary part of the refractive index of metals. Metal deposited on top of silicon can thus act as an absorber. Although a larger fraction of an incident optical wave is reflected according to the Fresnel equation, a small fraction is transmitted and absorbed inside the metal.

The silicon layer used for the waveguide layer (e.g., the silicon layer above the BOX layer of a SOI wafer) is typically about 220 nm to about 500 nm thick. Doping this relatively small thickness of a silicon layer may not absorb stray light as effectively as germanium, however, the stray light will pass through the light absorbing structures in the silicon layer multiple times, so the amount of absorption can still be effective for mitigating the effects of stray light on photonic device characteristics such as dynamic range. Alternatively, a potentially thicker silicon layer, deposited by subsequent CMOS process steps, can be used to form the doped silicon light absorbing structures. The thicker the silicon, and the more it is doped, the higher the absorption will be.

Figure 2:
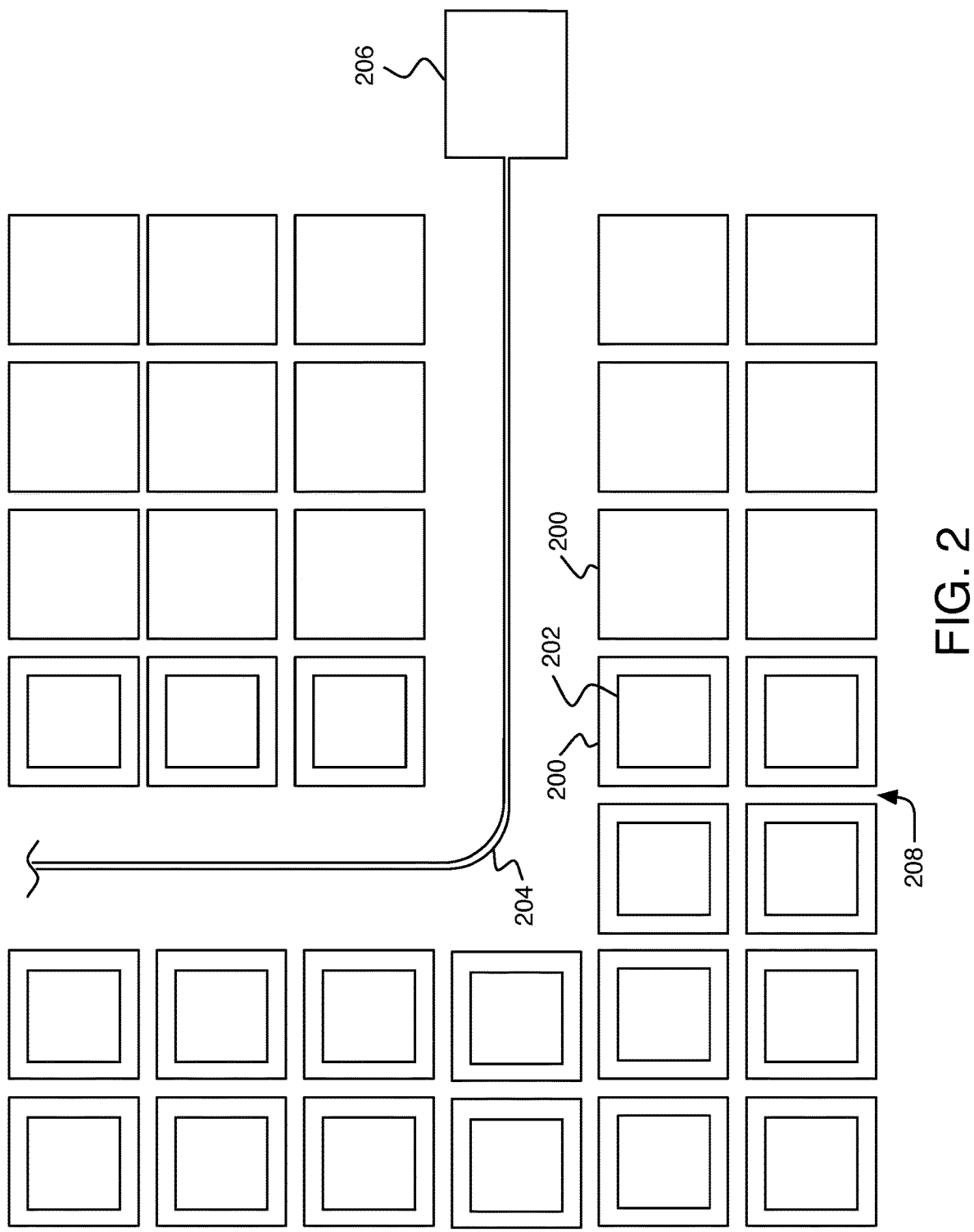
FIG. 2 is a schematic diagram showing a portion of a photonic circuit showing an arrangement of light absorbing structures in the general vicinity of a waveguide and a photodetector.

Referring to FIG. 2, a portion of a photonic circuit shows an arrangement of light absorbing structures in the general vicinity of a waveguide 204 and a photodetector 206. Some CMOS fabrication rules may require certain tiling patterns be used for various purposes. The rules may specify density of tiles, dimensions and shapes of tiles, or various other characteristics, for example, for certain other mechanical or fabrication process purposes for which the tiling is used. The tiling patterns may fill otherwise unused area in a PIC, such as area around the waveguide 204, as shown in FIG. 2. In this example, the tiles have a square shape and even spacing, but in other examples any polygons that are able to be arranged into a tiled pattern may be used, and the tiling pattern may have different spacing between adjacent tiles in different dimensions. The trenches 208 between the tiles may be filled with a material (e.g., silicon dioxide) used for a layer deposited or grown on top of a silicon layer from which the tiles are formed.

However the tiles are arranged geometrically, such tiling structures can be used to fabricate light absorbing structures, for example, by doping silicon tiles and/or by adding germanium to the tiles. In this example, some light absorbing structures are formed from a doped silicon tile 200 without any germanium in contact with the doped silicon, and some light absorbing structures are formed from a silicon tile 200 with a germanium tile 202 grown on a portion of the surface of the silicon tile 200, where the doping of that tile could vary from undoped to very highly doped. In this example, the light absorbing structures closest to the photodetector 206 use just the doped silicon tile 200 without germanium due to a fabrication design rule that limits how close germanium tiling can be to photonic structures that contain germanium, such as the photodetector 206. But, with sufficient spacing from the photodetector 206 (e.g., a distance of at least 100 microns), the light absorbing structures can use both the doped silicon tile 200 and the germanium tile 202 (or the germanium tile 202 without the doped silicon tile 200).

In some cases, changes to the tiling pattern can be made while staying within the fabrication rules (or by modest changes to the fabrication rules) to optimize size and/or placement of the light absorbing structures. For example, larger tiles can be used to cover a larger percentage of a large otherwise unused area, or smaller tiles can be used to more closely conform to the edges of an area that has a higher density of device photonic structures.

The following experimental results provide quantitative estimates of the effects of the light absorbing structures on the performance of certain photonic devices, by way of example only. A variety of performance results may be obtained for different levels of doping, different arrangement of tiles or other shapes and/or arrangements of light absorbing structures. These estimates are based on results from prototype SiP dies on which the optical front end of a coherent receiver has been fabricated.

A first prototype SiP die included germanium tiles without doped silicon, to assess the effects of the germanium. With 8% tiling density (averaged over the entire surface of the SiP die), the improvement in dynamic range was about 1.5 dB. In some experiments, the improvement in dynamic range was approximately directly proportional to the tiling density. The tiling density can be increased to significantly higher than 8% in some cases, depending on the density of photonic structures. For example, in a relatively standard device configuration, the germanium density can be increased to about 25% to 30%, which would provide about a 5 dB to 7 dB increase in dynamic range. A second prototype SiP die included P++ doped silicon tiles without germanium. With 20% tiling density, the improvement in dynamic range was about 1.0 dB. In a relatively standard device configuration, the doped silicon tiling density can be increased to about 30% to 40%, which would provide a 1.5 dB to 2.0 dB increase in dynamic range. The doped silicon tiling alone without germanium is not as effective as structures that include germanium in absorbing (and thus reducing) the stray light, but the doped silicon tiling could be used in SiP/CMOS process flow in which germanium is not available. Alternatively, doped silicon tiling could be used in combination with germanium tiling, as described above, and it is expected that the benefits of each type of tiling add to increase the total absorption and thus and improve the overall dynamic range.

The absorbing of stray light using light absorbing structures as described herein can be combined with various other techniques for absorbing stray light and/or mitigating the effects of remaining stray light. For example, in some implementations, the top surface of a SiP die can be covered with a light absorbing adhesive (e.g., epoxy) that will effectively absorb additional stray light. However, dispensing adhesives on small PIC chips can be relatively complex due to the need to cover the maximal surface, while avoiding any wirebonds, optical bonding surfaces, and RF lines, as any adhesive on these surfaces can affect reliability, performance, and processing. The adhesive dispensing process may also be difficult to control, and thus could have a notable impact on yield. The additional step of applying the adhesive may also add cost to the product with extra dispensing equipment and curing operations. For implementations that do not apply such an adhesive, standard steps in a CMOS fabrication process can be used, as described herein, for potentially an insignificant cost or yield impact.

If there is a predictable amount of stray light that will remain, even if some stray light is absorbed, there are some techniques that mitigate the effects of the stray light using calibration tables. For example, with a single photodetector, the effect of stray light and reverse-bias leakage (also called "dark current") can be reduced to an extent using calibration tables to measure the responsivity of the stray light and dark current as a function of wavelength and temperature. These extensive calibration tables come at the real cost of notably increased test time on every manufactured part. So, for implementations that do not use such calibration tables, there may also be significant cost reduction. There may also be difficulty in accurately predicting the quality of the calibration tables as the products age because of the complex nature of the optical interference signal.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:
1. An article of manufacture, comprising:
a photonic integrated circuit that includes one or more silicon layers, where at least a first silicon layer comprises:
a plurality of photonic structures, where the photonic structures include one or more waveguides and one or more photodetectors, and
a plurality of light absorbing structures, where the light absorbing structures include a first set of light absorbing structures each consisting essentially of a doped silicon structure and a second set of light absorbing structures each consisting essentially of a doped or undoped silicon structure at least partially covered with germanium; and
at least a first waveguide in the photonic integrated circuit for receiving light into at least one of the silicon layers.

2. The article of manufacture of claim 1, further comprising:
   at least a first input port in the photonic integrated circuit for receiving first light into the first waveguide, the first light characterized by a first intensity; and
   at least a second input port in the photonic integrated circuit for receiving second light into a waveguide in one of the silicon layers, the second light characterized by a second intensity lower than the first intensity;
   wherein at least a first photodetector of the one or more photodetectors is positioned at a location in the photonic integrated circuit that: (1) receives a portion of the second light from a first waveguide coupled to the first photodetector, and (2) receives a portion of the first light scattered into the first photodetector from a portion of the photonic integrated circuit other than the first waveguide.

3. The article of manufacture of claim 1, where the first silicon layer comprises a layer of silicon in a silicon-on-insulator structure that includes a layer of silicon dioxide adjacent to the layer of silicon.

4. The article of manufacture of claim 1, where the doped silicon of one or more of the light absorbing structures in the first set is characterized by a dopant concentration of greater than $10^{18}$ atoms per cubic centimeter.

5. The article of manufacture of claim 1, where the quantity of light absorbing structures in the first set is greater than the quantity of light absorbing structures in the second set.

6. The article of manufacture of claim 5, where at least one of the photodetectors in the first silicon layer is closer to a plurality of the light absorbing structures in the first set than to any of the light absorbing structures in the second set.

7. The article of manufacture of claim 1, where at least one photodetector comprises a photodiode formed at least in part from germanium covering a portion of the doped silicon of the first silicon layer.

8. The article of manufacture of claim 1, where the light absorbing structures include a plurality of doped silicon structures that each has a cross-sectional shape that is approximately a polygon, in a cross-sectional plane within the first silicon layer.

9. The article of manufacture of claim 8, where the plurality of doped silicon structures are each in proximity to neighboring doped silicon structures that together form a tiled pattern in the cross-sectional plane.

10. The article of manufacture of claim 9, where the plurality of doped silicon structures are each separated from neighboring doped silicon structures in the cross-sectional plane by silicon dioxide.

11. A method for fabricating a photonic integrated circuit, the method comprising:
    fabricating structures in one or more silicon layers, where at least a first silicon layer comprises:
        a plurality of photonic structures, where the photonic structures include one or more waveguides and one or more photodetectors, and
        a plurality of light absorbing structures, where the light absorbing structures include a first set of light absorbing structures each consisting essentially of a doped silicon structure and a second set of light absorbing structures each consisting essentially of a doped or undoped silicon structure at least partially covered with germanium; and
    fabricating at least one waveguide in the photonic integrated circuit for receiving light into at least one of the silicon layers.

12. The method of claim 11, further comprising fabricating in the photonic integrated circuit:
    at least a first input port for receiving first light into the first waveguide, the first light characterized by a first intensity; and
    at least a second input port for receiving second light into a waveguide in one of the silicon layers, the second light characterized by a second intensity lower than the first intensity;
    wherein at least a first photodetector of the one or more photodetectors is positioned at a location in the photonic integrated circuit that: (1) receives a portion of the second light from a first waveguide coupled to the first photodetector, and (2) receives a portion of the first light scattered into the first photodetector from a portion of the photonic integrated circuit other than the first waveguide.

13. The method of claim 11, where the first silicon layer comprises a layer of silicon in a silicon-on-insulator structure that includes a layer of silicon dioxide adjacent to the layer of silicon.

14. The method of claim 11, where the doped silicon of one or more of the light absorbing structures in the first set is characterized by a dopant concentration of greater than $10^{18}$ atoms per cubic centimeter.

15. The method of claim 11, where the quantity of light absorbing structures in the first set is greater than the quantity of light absorbing structures in the second set.

16. The method of claim 15, where at least one of the photodetectors in the first silicon layer is closer to a plurality of the light absorbing structures in the first set than to any of the light absorbing structures in the second set.

17. The method of claim 11, where at least one photodetector comprises a photodiode formed at least in part from germanium covering a portion of the doped silicon of the first silicon layer.

18. The method of claim 11, where the light absorbing structures include a plurality of doped silicon structures that each:
    has a cross-sectional shape that is approximately a polygon, in a cross-sectional plane within the first silicon layer,
    is in proximity to neighboring doped silicon structures that together form a tiled pattern in the cross-sectional plane, and
    is separated from neighboring doped silicon structures in the cross-sectional plane by silicon dioxide.

* * * * *